(12) United States Patent
Kalnitsky et al.

(10) Patent No.: US 6,962,842 B1
(45) Date of Patent: Nov. 8, 2005

(54) METHOD OF REMOVING A SACRIFICIAL EMITTER FEATURE IN A BICMOS PROCESS WITH A SUPER SELF-ALIGNED BJT

(75) Inventors: Alexander Kalnitsky, San Francisco, CA (US); Sang H. Park, Portland, OR (US); Viktor Zekeriya, Atherton, CA (US); Larry Wang, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/382,597

(22) Filed: Mar. 6, 2003

(51) Int. Cl.[7] .................. H01L 21/8238; H01L 29/00
(52) U.S. Cl. .................. 438/202; 438/320; 438/322; 438/338; 438/353; 257/554; 257/560; 257/564
(58) Field of Search .................. 438/199, 218, 438/229, 235, 314, 318, 320, 321, 338, 339, 438/353, 364, 365, 202, 311, 322, 326; 257/552, 257/554, 560, 564, 197

(56) References Cited

U.S. PATENT DOCUMENTS

| 6,486,532 B1 * | 11/2002 | Racanelli .................. 257/571 |
|---|---|---|
| 6,492,238 B1 | 12/2002 | Ahlgren et al. |
| 6,534,372 B1 * | 3/2003 | Racanelli .................. 438/321 |
| 6,600,199 B2 * | 7/2003 | Voldman et al. .......... 257/370 |
| 6,716,711 B1 * | 4/2004 | Racanelli .................. 438/321 |
| 2002/0132438 A1 | 9/2002 | Dunn et al. |

* cited by examiner

Primary Examiner—Alonzo Chambliss
(74) Attorney, Agent, or Firm—Blakely, Sokoloff, Taylor & Zafman LLP

(57) ABSTRACT

A method of removing a sacrificial emitter feature in a bipolar complementary metal oxide semiconductor (BICMOS) process with a super self-aligned bipolar junction transistor (BJT) is disclosed. According to the new method, a mask layer, such as an oxide deposited using high density plasma (HDP) techniques, is deposited over an extrinsic base layer and over a sacrificial emitter structure. Because of the particular characteristic of the HDP oxide, the deposition of HDP oxide forms a triangular-like structure over the sacrificial emitter structure having a maximum thickness less than the thickness of the HDP oxide over the extrinsic base layer. This facilitates the complete removal of the HDP oxide above the sacrificial emitter layer without the complete removal of the HDP oxide above the extrinsic base layer. This allows the removal of the sacrificial emitter structure while the remaining HDP oxide, serving as a mask, protects the underlying extrinsic base layer.

11 Claims, 10 Drawing Sheets

METHOD OF REMOVING A SACRIFICIAL EMITTER FEATURE IN A BICMOS PROCESS WITH A SUPER SELF-ALIGNED BJT

FIELD OF THE INVENTION

This invention relates generally to semiconductor processing, and in particular, to a method of removing a sacrificial emitter feature in a bipolar complementary metal oxide semiconductor (BICMOS) process with a super self-aligned bipolar junction transistor (BJT).

BACKGROUND OF THE INVENTION

Bipolar junction transistors (BJTs) are commonly formed in integrated circuits along side with complementary metal oxide semiconductor (CMOS) devices. Such simultaneous manufacturing of these two different types of devices is sometimes referred to in the relevant art as a BICMOS process. In a BICMOS process, one or more isolation structures are typically formed within a substrate to electrically isolate the bipolar device from the CMOS device. Once the isolation structures are formed, the BICMOS process continues to complete the manufacturing of the CMOS and bipolar devices.

With regard to the manufacturing of the BJT device, typically the process entails forming a buried collector region within the substrate, forming an intrinsic base layer over the buried collector region above the substrate, forming a sacrificial emitter structure above the intrinsic base layer, forming an extrinsic base layer over the intrinsic base layer which is self-aligned to the sacrificial emitter feature, removing the sacrificial emitter structure, and forming the permanent emitter structure. The sacrificial emitter structure is formed for the purpose of forming a self-aligned extrinsic base layer. Once the extrinsic base layer is formed, the sacrificial emitter structure can be removed.

In removing the sacrificial emitter structure, the typical BICMOS process consists of using standard photolithography or chemical-mechanical polishing (CMP) techniques to remove the sacrificial emitter structure. Such techniques are rather expensive, time-consuming, and complex.

Thus, there is a need for a new method of removing a sacrificial emitter feature in a BICMOS process which is less expensive, time-consuming, and/or less complex. Such need and others are met with the following described method of removing a sacrificial emitter feature in a BICMOS process in accordance with the invention.

SUMMARY OF THE INVENTION

In general, the invention relates to a method of removing a sacrificial emitter feature in a bipolar complementary metal oxide semiconductor (BICMOS) process with a super self-aligned bipolar junction transistor (BJT). According to the new method, a mask layer, such as an oxide deposited using high density plasma (HDP) techniques, is deposited over an extrinsic base layer and over a sacrificial emitter structure. Because of particular characteristic of this mask layer, the deposition of this mask layer forms a triangular-like structure over the sacrificial emitter structure having a maximum thickness less than the thickness of the mask layer over the extrinsic base layer. This facilitates the complete removal of the mask layer above the sacrificial emitter layer without the complete removal of the mask layer above the extrinsic base layer. This allows the removal of the sacrificial emitter structure while the mask layer protects the underlying extrinsic base layer.

More specifically, a first aspect of the invention relates to a method of forming a bipolar device. The method entails forming a collector implant region within a substrate; forming an intrinsic base structure over the collector implant region; forming a sacrificial emitter structure over the intrinsic base structure; forming an extrinsic base structure over the intrinsic base region and adjacent to the sacrificial emitter structure; forming a first portion of a mask layer over the extrinsic base region and a second portion of the mask layer over the sacrificial emitter structure, wherein a thickness of the first portion of the mask layer is greater than a thickness of the second portion of the mask layer; removing the second portion of the mask layer; and removing the sacrificial emitter structure while the first portion of the mask layer protects the extrinsic base structure.

A second aspect of the invention relates to a method of forming a bipolar device and CMOS device. The method entails forming an isolation structure within a substrate; forming a collector implant region within the substrate on a first side of the isolation structure; forming a polysilicon gate of the CMOS device above the substrate and laterally on a second side of the isolation structure, wherein the second side is opposite the first side; forming a protection layer over the polysilicon gate; forming an intrinsic base structure over the collector implant region; forming a sacrificial emitter structure over the intrinsic base structure; forming an extrinsic base structure over the intrinsic base region and adjacent to the sacrificial emitter structure; forming a first portion of a mask layer over the extrinsic base structure and a second portion of the mask layer over the sacrificial emitter structure, wherein a thickness of the first portion of the mask layer is greater than a thickness of the second portion of the mask layer; removing the second portion of the mask layer; and removing the sacrificial emitter structure while the first portion of the mask layer protects the extrinsic base structure.

A third aspect of the invention relates to a method of forming first and second bipolar devices. The method entails forming first and second collector implant regions within a substrate; forming an isolation structure within the substrate and between the first and second collector regions; forming an intrinsic base layer over the first and second collector implant regions; forming a sacrificial emitter layer over the intrinsic base layer; forming first and second sacrificial emitter structures from the sacrificial emitter layers, wherein the first and second sacrificial emitter structures are situated respectively over the first and second collector regions; forming an extrinsic base layer over the intrinsic base layer; forming a first portion of a mask layer over the extrinsic base region, and second and third portions of the mask layer respectively over the first and second sacrificial emitter structures, wherein a thickness of the first portion of the mask layer is greater than a thickness of the second and third portions of the mask layer; removing the second and third portions of the mask layer; and removing the first and second sacrificial emitter structures while the first portion of the mask layer protects the extrinsic base layer.

Other aspects, features and techniques of the invention will become apparent to one skilled in the relevant art in view of the following detailed description of the invention.

DETAILED DESCRIPTION OF THE INVENTION

Figure 1:
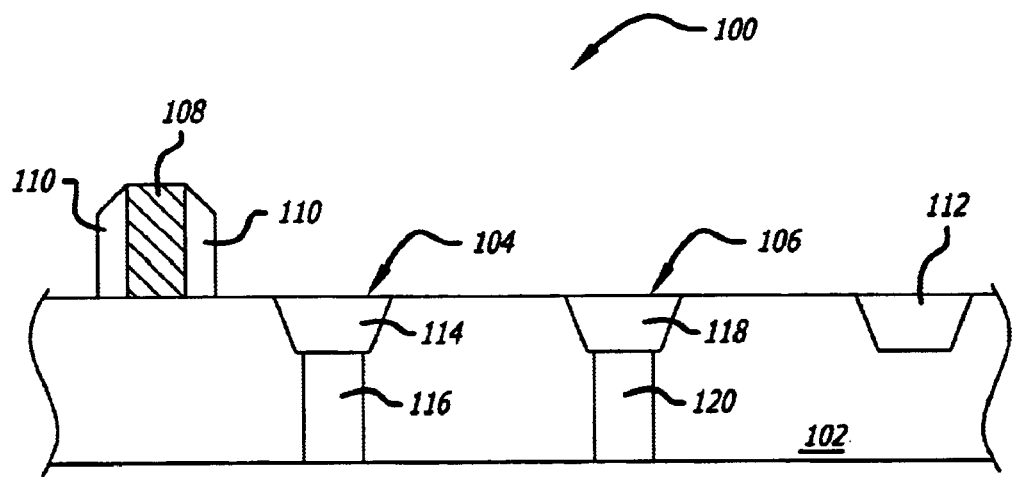
FIGS. 1–20 illustrate cross-sectional views of a semiconductor device at various stages of a method of removing a sacrificial emitter feature in a BICMOS process with a super self-aligned BJT in accordance with an embodiment of the invention.

FIG. 1 illustrates a cross-sectional view of a semiconductor device 100 at an intermediate stage of a method of removing a sacrificial emitter feature in a BICMOS process with a super self-aligned BJT in accordance with an embodiment of the invention. At this stage, the semiconductor device 100 comprises a substrate 102, first and second isolation structures, such as shallow and deep trench isolation structures 104 and 106, a doped polycrystalline silicon ("polysilicon") gate 108 with spacer 110 on its sidewall, and a stand-alone isolation structure, such as shallow trench isolation structure 112. The shallow and deep trench isolation structures 104 and 106 respectively comprise shallow trench portions 114 and 118 formed near the surface of the substrate 102, and deep trench portions 116 and 120 formed within the substrate respectively below the shallow trench portions 114 and 118. In this example, the thickness of the polysilicon gate is about 2000 to 2500 angstroms.

Figure 2:
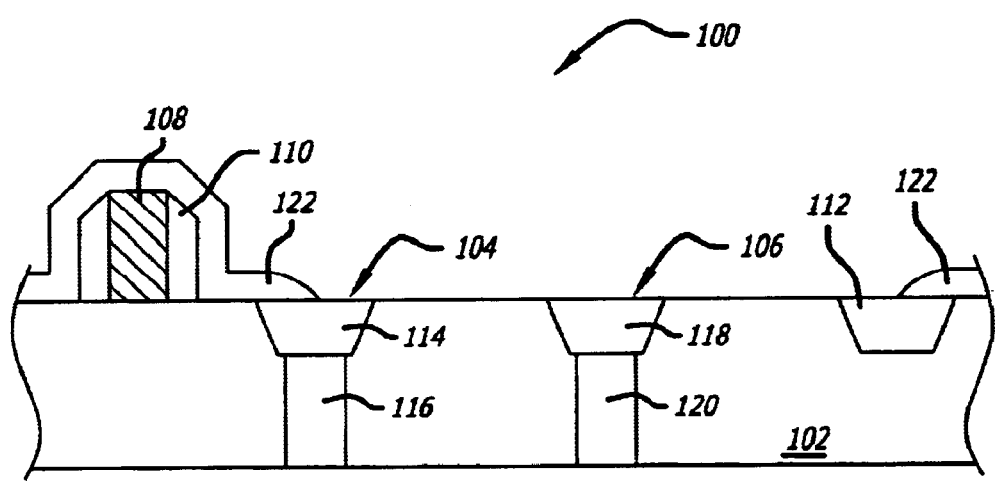

FIG. 2 illustrates a cross-sectional view of the semiconductor device 100 at a subsequent stage of a method of removing a sacrificial emitter feature in a BICMOS process with a super self-aligned BJT in accordance with an embodiment of the invention. According to the method, a protection layer 122 is formed over the polysilicon gate 108 and spacer 110. The protection layer 122 protects the underlying polysilicon gate 108 and spacer 110 from subsequent BJT forming process. An example of a protection layer 122 includes silicon dioxide ($SiO_2$) formed by chemical vapor deposition (CVD) in the case where the spacer 110 is formed of silicon nitride ($Si_3N_4$). Another example of a protection layer 122 includes silicon nitride ($Si_3N_4$) formed by low pressure chemical vapor deposition (LPCVD) to a thickness of about 100 angstroms and an additional layer of silicon dioxide ($SiO_2$) formed by CVD in the case where the spacer is formed of an oxide-nitride-oxide (ONO) stack.

Figure 3:
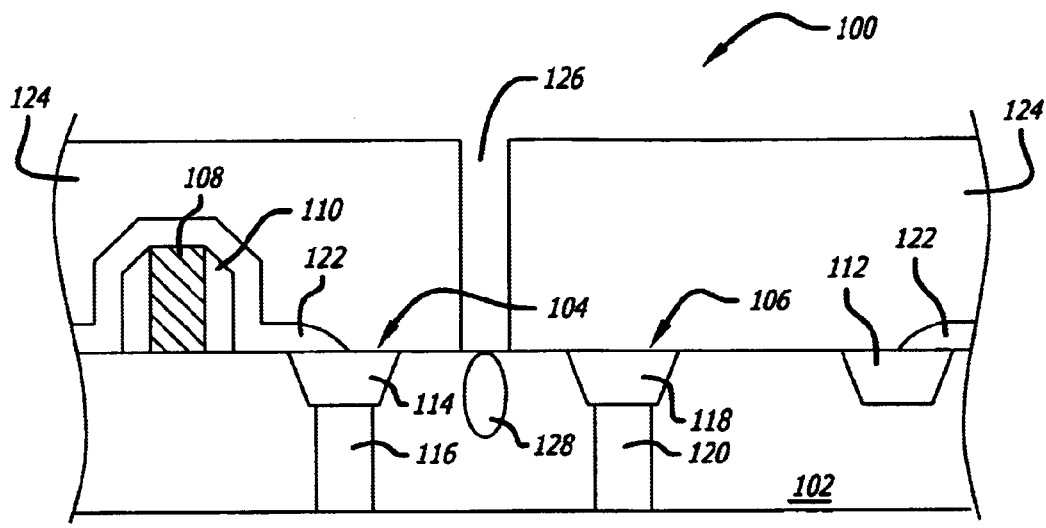

FIG. 3 illustrates a cross-sectional view of the semiconductor device 100 at a subsequent stage of a method of removing a sacrificial emitter feature in a BICMOS process with a super self-aligned BJT in accordance with an embodiment of the invention. According to the method, a mask layer 124 with a window 126 is formed over the semiconductor device 100. The window 126 is situated over a region of the substrate 102 in which a vertical junction region of a narrow bipolar transistor is to be formed. In this example, the width of the window is approximately ≧0.2 micrometers. After the mask 124 with window 126 is formed, the semiconductor device 100 undergoes a series of ion implantation processes to form a first collector implant region 128. These implants determine the device breakdown voltage and speed. Since some of the technology applications may require several types of bipolar devices with varying speed-breakdown trade-off as well as very different emitter sizes a series of such masking/implantation sequences may be performed. After the first collector implant region 128 is formed, the mask layer 124 is removed.

Figure 4:
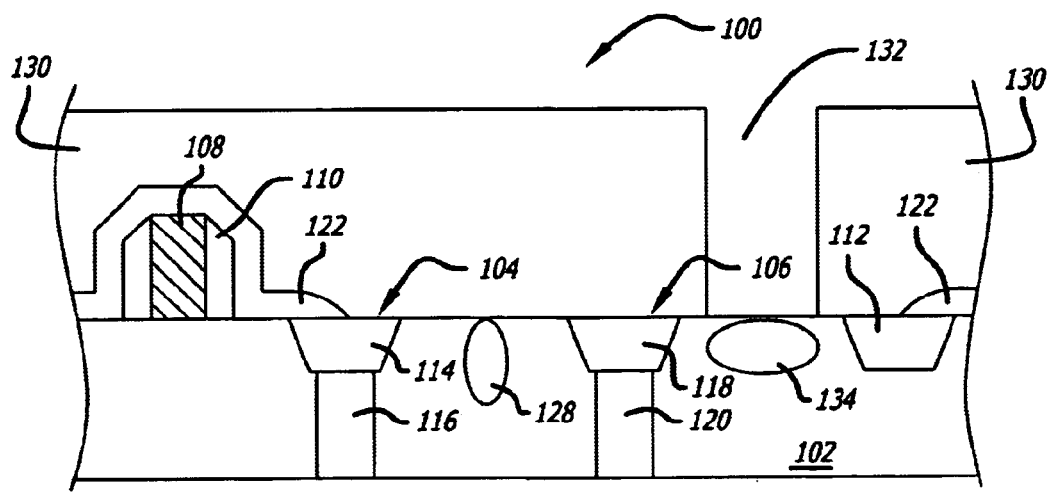

FIG. 4 illustrates a cross-sectional view of the semiconductor device 100 at a subsequent stage of a method of removing a sacrificial emitter feature in a BICMOS process with a super self-aligned BJT in accordance with an embodiment of the invention. According to the method, an optional mask layer 130 with a window 132 is formed over the semiconductor device 100. The window 132 is situated over a region of the substrate 102 in which a vertical junction region of a wide bipolar transistor is to be formed. In this example, a device is illustrated with an approximate 0.6 micrometer wide emitter, the width of the window is approximately 0.7 micrometers. After the mask 130 with window 132 is formed, the semiconductor device 100 undergoes a series of ion implantation processes to form the second collector implant region 134. After the second collector implant region 134 is formed, the mask layer 130 is removed.

Figure 5:
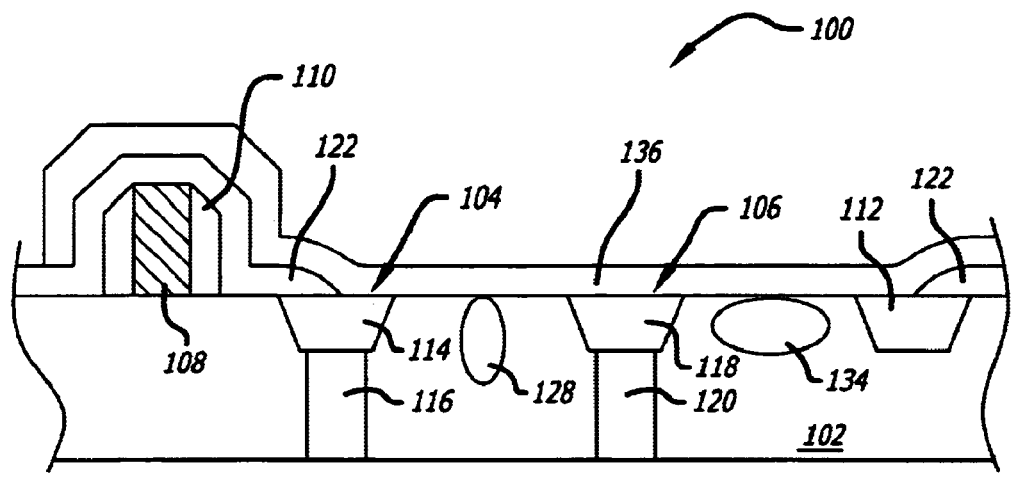

FIG. 5 illustrates a cross-sectional view of the semiconductor device 100 at a subsequent stage of a method of removing a sacrificial emitter feature in a BICMOS process with a super self-aligned BJT in accordance with an embodiment of the invention. According to the method, an intrinsic base epitaxial layer 136 is formed over the substrate 102. In particular, the intrinsic base epitaxial layer 136 is formed over the protection layer 122, the shallow and deep trench isolation structures 104 and 106, the shallow trench isolation 112, and the first and second collector implant regions 128 and 134. This epitaxial layer, which is comprised of Si, SiGe or SiGe:C, will form a mono-crystalline film over the exposed substrate 102 and a poly-crystalline film over dielectric layers.

Figure 6:
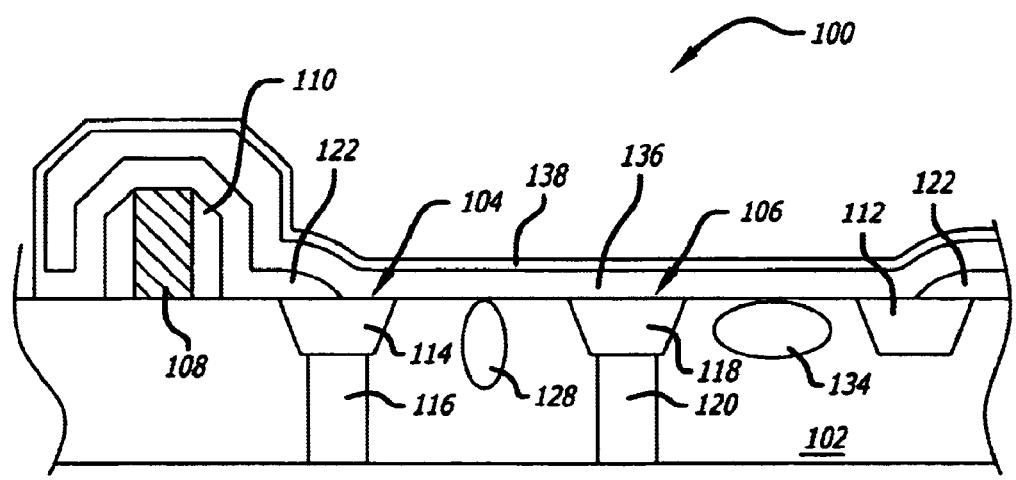

FIG. 6 illustrates a cross-sectional view of the semiconductor device 100 at a subsequent stage of a method of removing a sacrificial emitter feature in a BICMOS process with a super self-aligned BJT in accordance with an embodiment of the invention. According to the method, a silicon dioxide ($SiO_2$) layer 138 is formed over the intrinsic base epitaxial layer 136. The silicon dioxide ($SiO_2$) layer 138 functions as an etch stop in the removal of the sacrificial emitter structure, as discussed later. The silicon dioxide ($SiO_2$) layer 138 may be formed to a thickness of about 75 angstroms by a low temperature steam oxidation of the top portion of the intrinsic base epitaxial layer 136 at about 750 degrees Celsius. Another example of forming the silicon dioxide ($SiO_2$) layer 138 is by chemical vapor deposition (CVD) of silicon dioxide ($SiO_2$) material.

Figure 7:
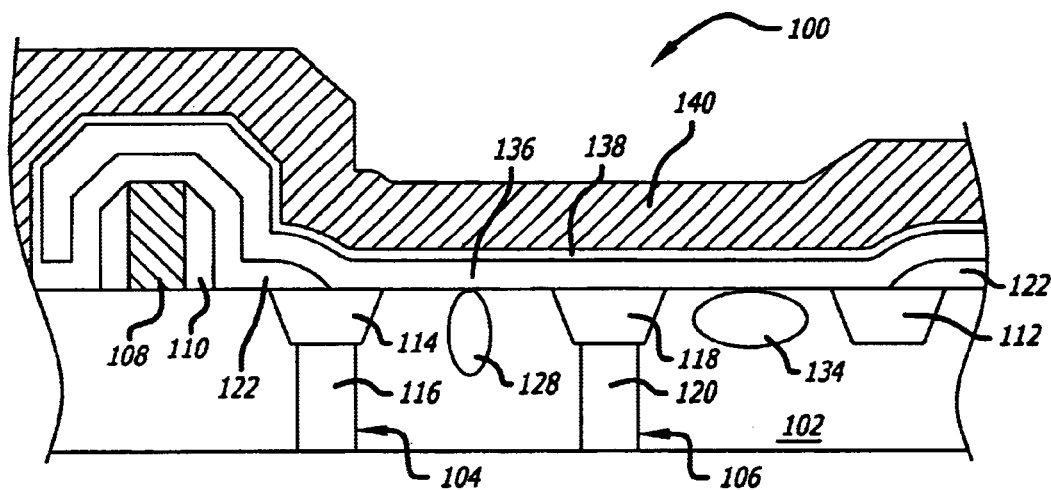

FIG. 7 illustrates a cross-sectional view of the semiconductor device 100 at a subsequent stage of a method of removing a sacrificial emitter feature in a BICMOS process with a super self-aligned BJT in accordance with an embodiment of the invention. According to the method, a sacrificial emitter polysilicon layer 140 is formed over the silicon dioxide ($SiO_2$) layer 138. The sacrificial emitter polysilicon layer 140 may be formed to a thickness of about 1000 to 4000 angstroms.

Figure 8:
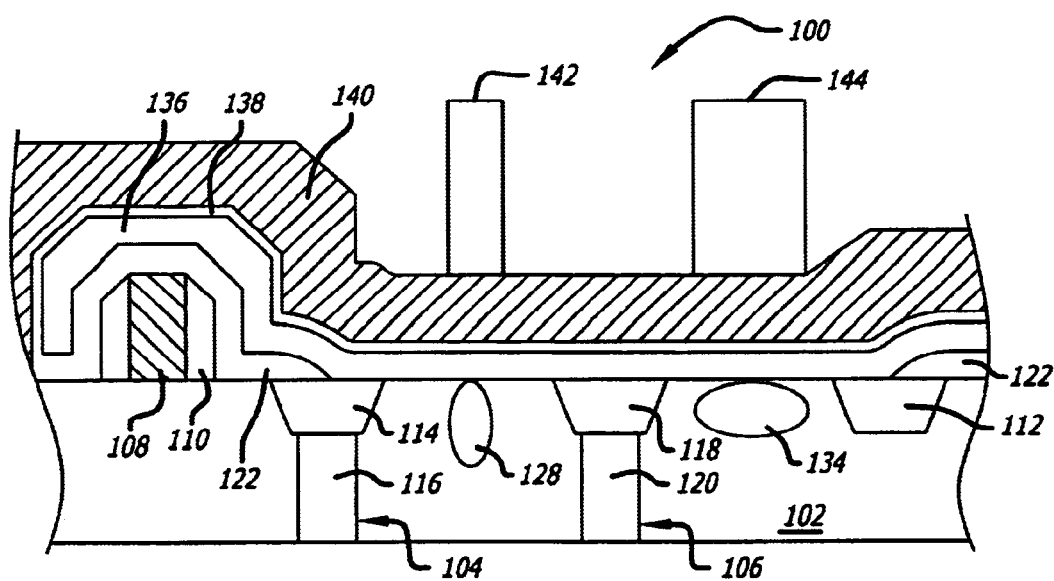

FIG. 8 illustrates a cross-sectional view of the semiconductor device 100 at a subsequent stage of a method of removing a sacrificial emitter feature in a BICMOS process with a super self-aligned BJT in accordance with an embodiment of the invention. According to the method, a pair of masks 142 and 144 are formed over the sacrificial emitter polysilicon layer 140, and specifically over the narrow vertical junction region 128 and wide vertical junction region 134, respectively.

Figure 9:
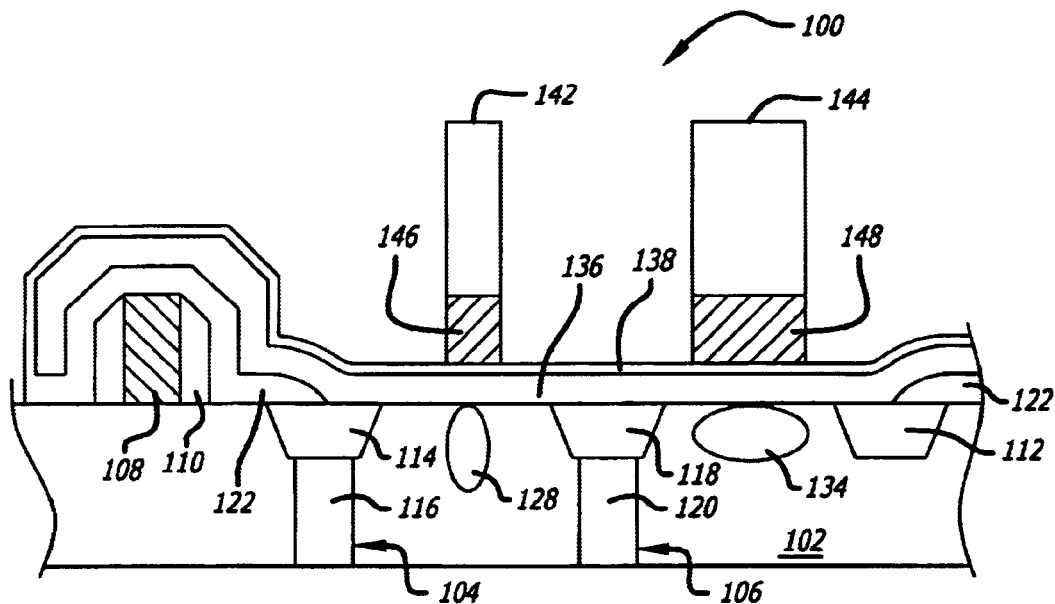

FIG. 9 illustrates a cross-sectional view of the semiconductor device 100 at a subsequent stage of a method of removing a sacrificial emitter feature in a BICMOS process with a super self-aligned BJT in accordance with an embodiment of the invention. According to the method, the sacrificial emitter polysilicon layer 140 is removed except at substantially under the masks 142 and 144. In this example, the sacrificial emitter polysilicon layer 140 is removed extensively to substantially clear polysilicon stringers on the CMOS poly-silicon topography. However, the etching of the sacrificial emitter polysilicon layer 140 should stop approximately at or part way into the top surface of the silicon dioxide ($SiO_2$) layer 138. This process leaves a pair of sacrificial emitter structures 146 and 148 respectively over the narrow vertical junction region 128 and wide vertical junction region 134. After the formation of the sacrificial emitter structures 146 and 148, the masks 142 and 144 are removed.

Figure 10:
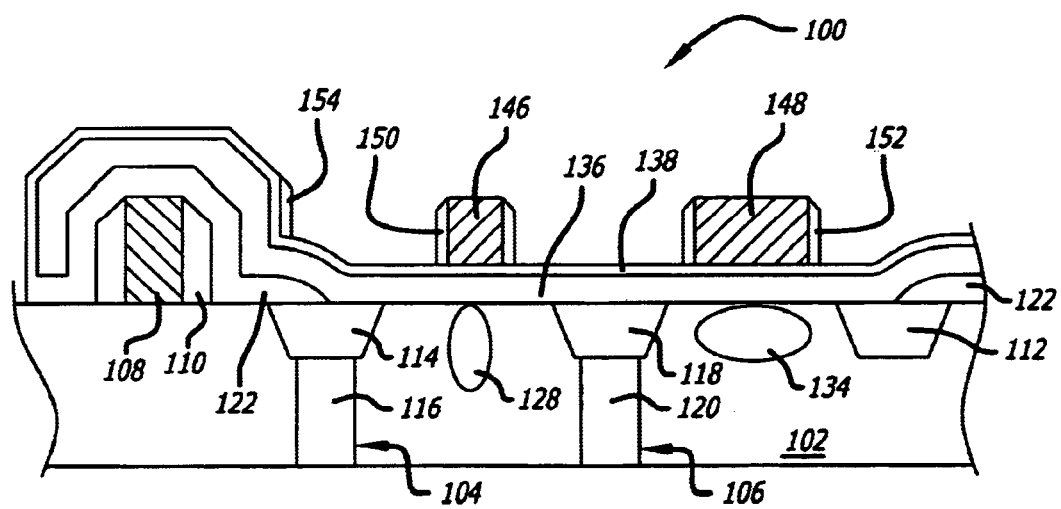

FIG. 10 illustrates a cross-sectional view of the semiconductor device 100 at a subsequent stage of a method of removing a sacrificial emitter feature in a BICMOS process with a super self-aligned BJT in accordance with an embodiment of the invention. According to the method, an optional link base implant may be performed to reduce the base resistance. In addition, spacers 150 and 152 are formed on the respective side walls of the sacrificial emitter structures 146 and 148. As an example of forming the spacers 150 and 152, silicon nitride ($Si_3N_4$) is deposited over the semiconductor device to a thickness greater than about 500 angstroms, then anisotropically etched to form the spacers 150 and 152. Another example of the side wall spacer formation may be a composite silicon dioxide/silicon nitride/silicon dioxide spacer. As a consequence of this spacer film deposition and etching process, a stringer 154 may form on the side wall of the vertical portion of the silicon dioxide ($SiO_2$) layer 138. The stringer 154 may be removed by masking and etching in hot phosphoric acid or in plasma.

Figure 11:
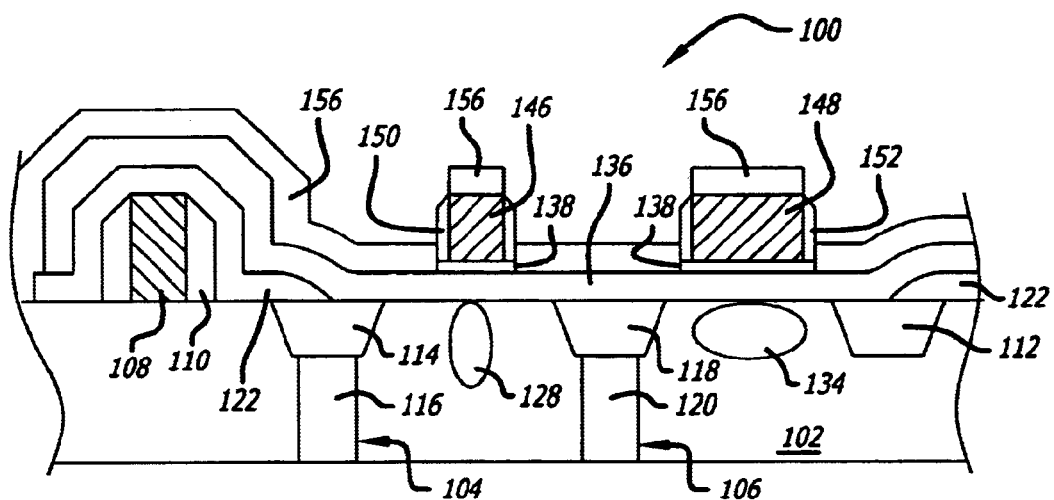

FIG. 11 illustrates a cross-sectional view of the semiconductor device 100 at a subsequent stage of a method of removing a sacrificial emitter feature in a BICMOS process with a super self-aligned BJT in accordance with an embodiment of the invention. According to the method, a pre-epitaxial cleaning of the semiconductor device 100 may be performed at this point. The cleaning of the semiconductor device 100 may be performed with hydrofluoric acid (HF) using industry-standard HF-last methods. Silicon dioxide ($SiO_2$) layer 138 will be etched away from the exposed base material substrate by HF during this step. Layer 138 will remain under sacrificial poly-silicon features 146 and 148, as well as under portions of side wall spacer features 150 and 142. After the cleaning, a heavily P-type doped, low temperature base epitaxial layer 156 is selectively deposited over the exposed silicon regions outside spacers 150 and 152 on top of the base material and on top of sacrificial emitter structures 146 and 148. As an example, the extrinsic base epitaxial layer 156 may be deposited to a thickness of greater than about 300 angstroms with the P-type doping level of greater than about 1E20 1/cm3.

Figure 12:
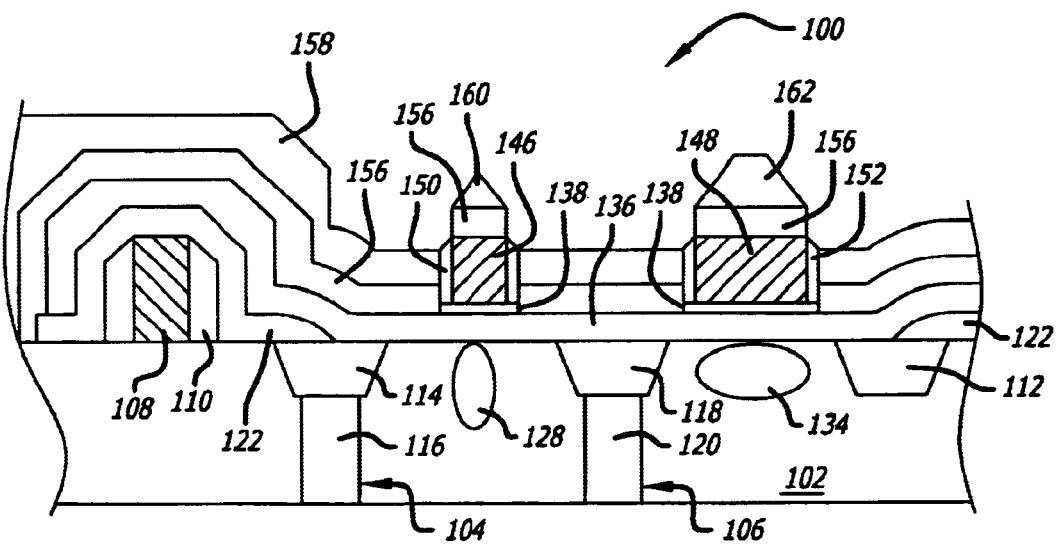

FIG. 12 illustrates a cross-sectional view of the semiconductor device 100 at a subsequent stage of a method of removing a sacrificial emitter feature in a BICMOS process with a super self-aligned BJT in accordance with an embodiment of the invention. According to the method, a second silicon dioxide ($SiO_2$) layer 158 is formed over the extrinsic base epitaxial layer 156. As an example, the second silicon dioxide ($SiO_2$) layer 158 may be deposited to a thickness of about 2500 angstroms using a high density plasma (HDP) process.

As seen in FIG. 12, the deposition of the second silicon dioxide ($SiO_2$) layer 158 forms triangular-like structures 160 and trapezoidal-like structures 162 respectively above the sacrificial emitter structures 146 and 148. The height of the trapezoidal-like structure 162 is approximately the total thickness of the second silicon dioxide layer 158 (e.g. 2500 angstroms) since the sacrificial polysilicon island 152 is wide enough to support that thickness. The height of the triangular-like structure 160 is about 1000 angstroms, since it is not wide enough to support the total thickness of the second silicon dioxide ($SiO_2$) deposition. In general, the maximum thickness of the triangular-like structure is approximately half the width of the underlying sacrificial emitter structure for appropriately chosen HDP deposition conditions.

Figure 13:
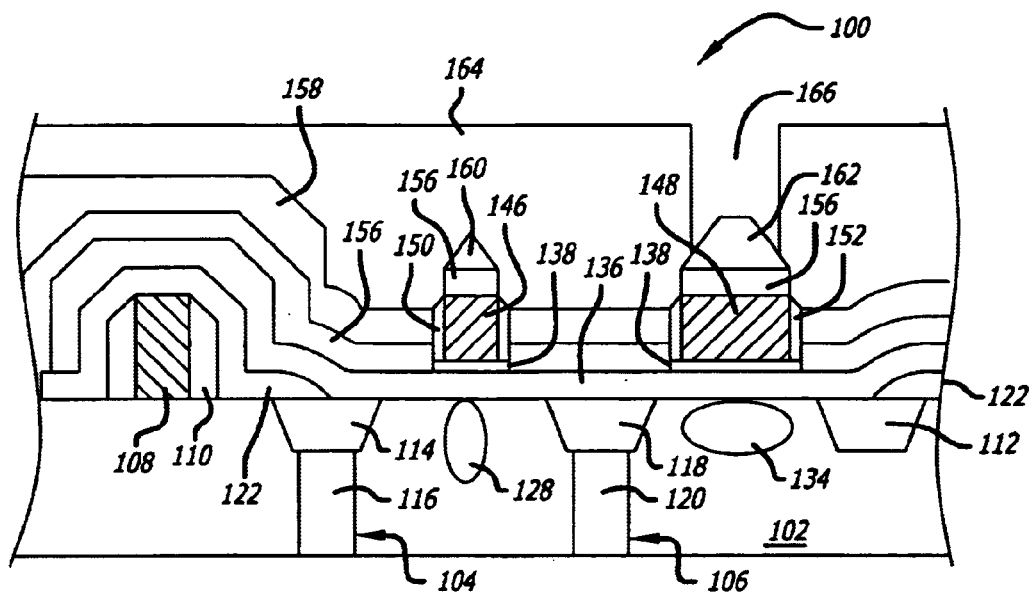

FIG. 13 illustrates a cross-sectional view of the semiconductor device 100 at a subsequent stage of a method of removing a sacrificial emitter feature in a BICMOS process with a super self-aligned BJT in accordance with an embodiment of the invention. According to the method, a mask 164 (e.g. photo resist) is formed over the semiconductor device 100 having an opening 166 directly over at least a central portion of the trapezoidal-like structure 162. In this example, the width of the opening 166 is approximately 0.4 micrometer for an approximately 0.6 micrometer wide emitter. This leaves approximately portions of the triangular-like structures 168 and 170 on either side of the opening 166 each having a width of about 0.1 micrometer, well within the capability range of modern photo-lithography tools.

Figure 14:
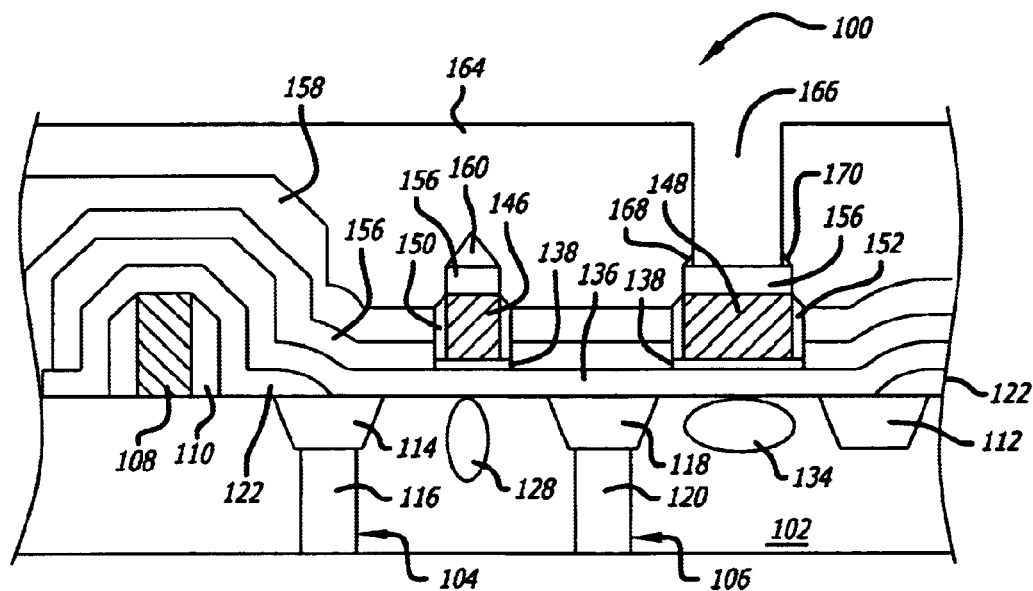

FIG. 14 illustrates a cross-sectional view of the semiconductor device 100 at a subsequent stage of a method of removing a sacrificial emitter feature in a BICMOS process with a super self-aligned BJT in accordance with an embodiment of the invention. According to the method, the flat portion of the trapezoidal-like structure 162 situated below the opening 166 of the mask is removed. In this example, the removal of the silicon dioxide ($SiO_2$) trapezoidal-like structure 162 may be performed using dry or wet etching techniques. In the case of dry etching the trapezoidal-like structure 162, lateral silicon dioxide ($SiO_2$) triangular-like structures 168 and 170 are formed above and on either side of the sacrificial emitter structure 148 each having a height ranging from about 0.04 micrometer to 0.16 micrometer. In the case of wet etching the trapezoidal-like structure 162, the lateral silicon dioxide ($SiO_2$) triangular-like structures 168 and 170 have a height of about 0.11 micrometer, with a lateral etch thereof of about 0.05 micrometer.

Figure 15:
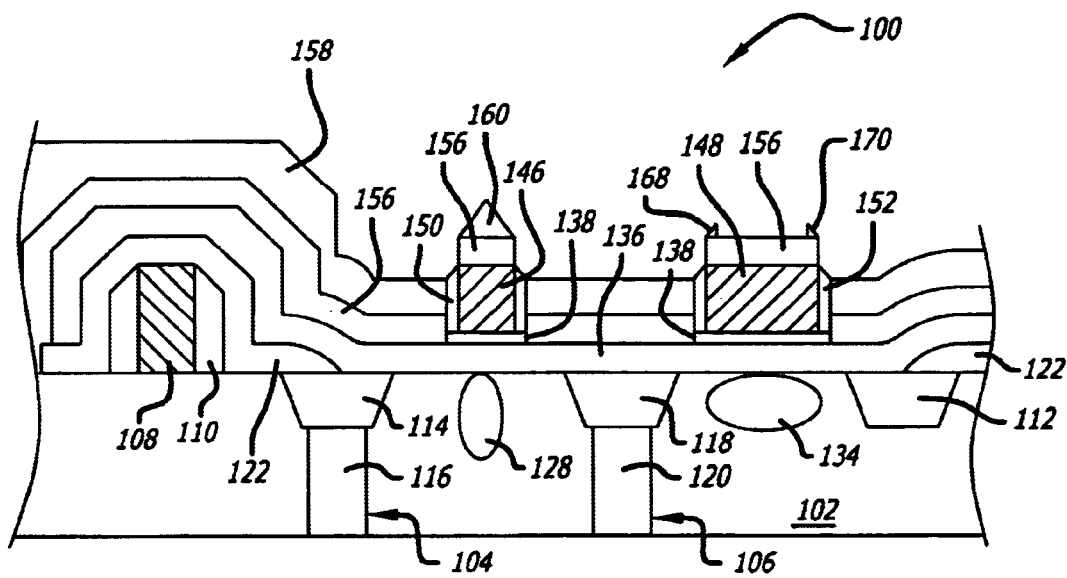

FIG. 15 illustrates a cross-sectional view of the semiconductor device 100 at a subsequent stage of a method of removing a sacrificial emitter feature in a BICMOS process with a super self-aligned BJT in accordance with an embodiment of the invention. According to the method, the mask 164 is removed. In this example, the maximum height of the silicon dioxide ($SiO_2$) triangular-like structures 168 and 170 is about 0.12 micrometer.

Figure 16:
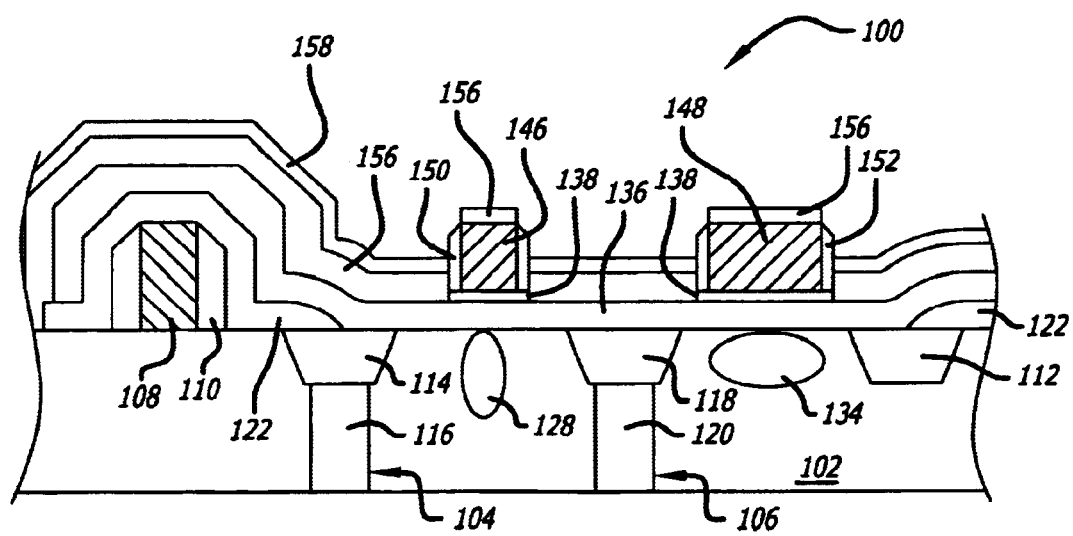

FIG. 16 illustrates a cross-sectional view of the semiconductor device 100 at a subsequent stage of a method of removing a sacrificial emitter feature in a BICMOS process with a super self-aligned BJT in accordance with an embodiment of the invention. According to the method, the HDP second silicon dioxide ($SiO_2$) layer 158 is etched back to remove the silicon dioxide ($SiO_2$) triangular-like structure 160 and the silicon dioxide ($SiO_2$) triangular-like structures 168 and 170. In this example, the removal of the silicon dioxide ($SiO_2$) triangular-like structure 160 and the lateral silicon dioxide ($SiO_2$) triangular-like structures 168 and 170 may be performed by reactive-ion etching (RIE) removing approximately 1500 angstroms of the HDP oxide. Alternatively, the removal of the silicon dioxide ($SiO_2$) triangular-like structure 160 and the silicon dioxide ($SiO_2$) triangular-like structures 168 and 170 may be performed by etching using hydrofluoric acid (HF) to remove greater than about 1000 angstroms of the HDP oxide.

Figure 17:
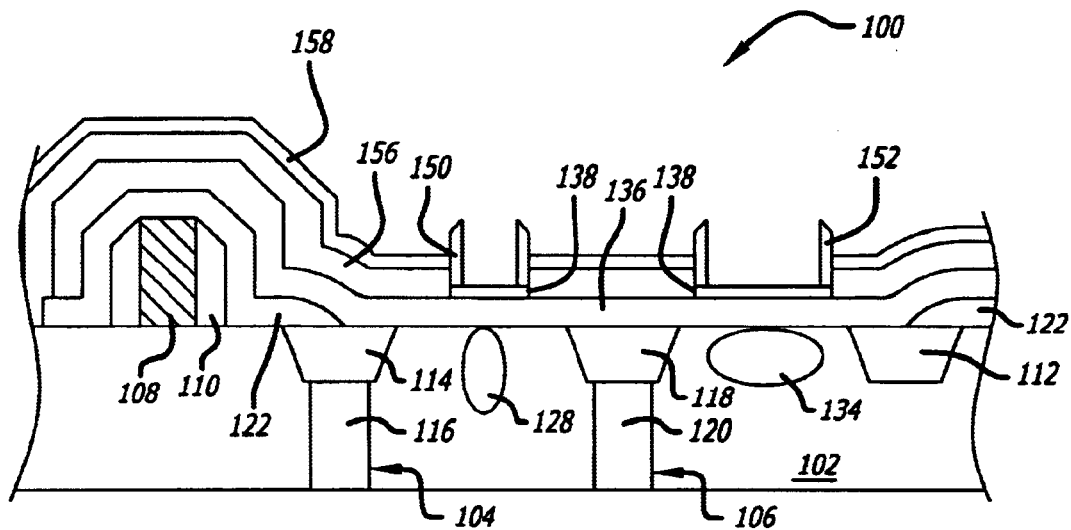

FIG. 17 illustrates a cross-sectional view of the semiconductor device 100 at a subsequent stage of a method of removing a sacrificial emitter feature in a BICMOS process with a super self-aligned BJT in accordance with an embodiment of the invention. According to the method, the sacrificial emitter structures 146 and 148 are then removed. In this example, the removal of the sacrificial emitter structures 146 and 148 may be performed by wet etching in a chorine, hydrazine, or other suitable etchants. Alternatively, the removal of the sacrificial emitter structures 146 and 148 may be performed by plasma etching as well. As discussed above, the first silicon dioxide (SiO$_2$) later 138 acts as an etch stop in the removal of the sacrificial emitter structures 146 and 148.

Figure 18:
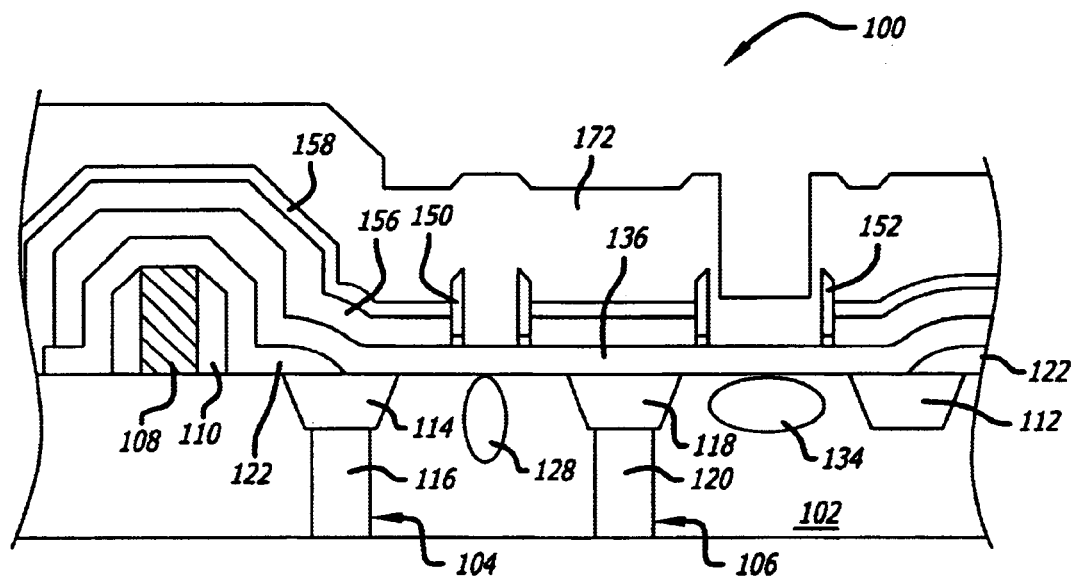

FIG. 18 illustrates a cross-sectional view of the semiconductor device 100 at a subsequent stage of a method of removing a sacrificial emitter feature in a BICMOS process with a super self-aligned BJT in accordance with an embodiment of the invention. According to the method, the semiconductor device 100 is subjected to a cleaning at this point. Silicon diode (SiO$_2$) layer 138 is etched away in hydrofluoric acid (HF) during this step. Then, an emitter polysilicon layer 172 is deposited over the semiconductor device 100, and specifically over the second silicon dioxide (SiO$_2$) layer 158 and the spacers 150 and 152. The emitter polysilicon layer 172 may be doped in-situ or may be deposited as an intrinsic material and doped after the deposition by ion implantation techniques.

Figure 19:
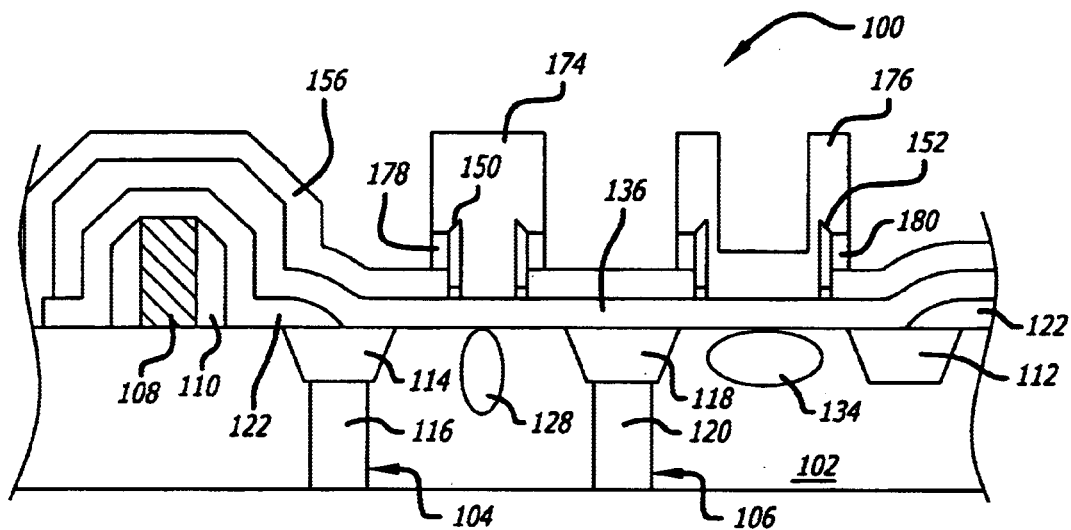

FIG. 19 illustrates a cross-sectional view of the semiconductor device 100 at a subsequent stage of a method of removing a sacrificial emitter feature in a BICMOS process with a super self-aligned BJT in accordance with an embodiment of the invention. According to the method, the emitter polysilicon layer 172 is etched to form permanent emitter structure 174 for the narrow bipolar transistor and permanent emitter structure 176 for the wide bipolar transistor. In addition, the second silicon dioxide (SiO$_2$) 158 is etched off except under the respective emitters 174 and 176. In which case, additional oxide spacers 178 and 180 are formed under the respective emitters 174 and 176. These spacers are intended to keep the silicide (formed after the described process) from bridging between base and emitter terminals of the bipolar transistor. If the height of these spacers is insufficient to prevent silicide bridging additional spacers surrounding the emitter poly feature may be required.

Figure 20:
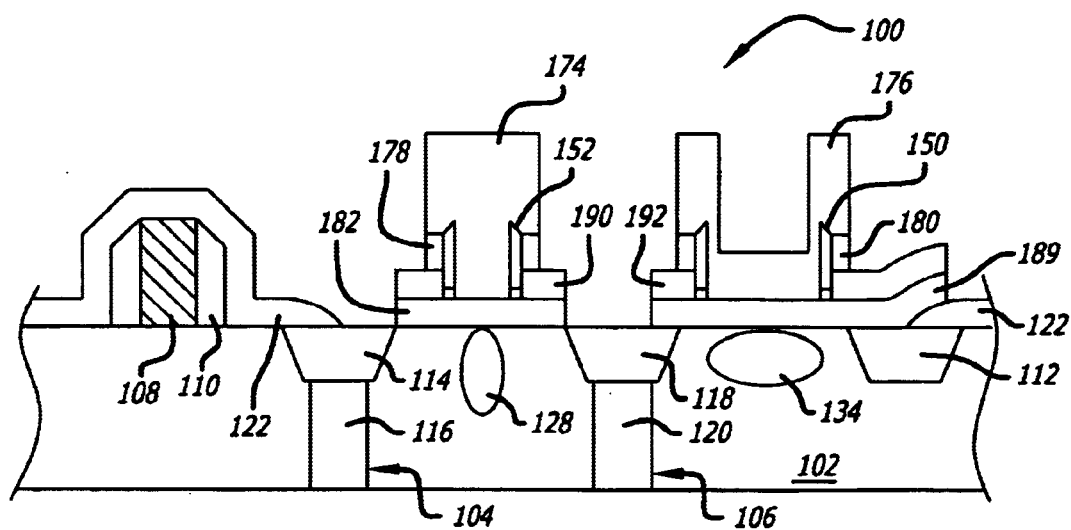

FIG. 20 illustrates a cross-sectional view of the semiconductor device 100 at a subsequent stage of a method of removing a sacrificial emitter feature in a BICMOS process with a super self-aligned BJT in accordance with an embodiment of the invention. According to the method, the base epitaxial layer 136 and the extrinsic base layer 156 are etched off by conventional photo-lithography. This step forms the respective intrinsic bases 182 and 184 and extrinsic bases 190 and 192 for the narrow emitter and the wide emitter bipolar transistors.

In summary, the second silicon dioxide (SiO$_2$) layer 158 acts as a mask for the removal of the sacrificial emitter structures 146 and 148. The properties of the HDP deposited oxide layer 158 forms triangular-like structures 160 and trapezoidal-like structures 162 above the respective sacrificial emitter structures 146 and 148, having maximum thickness less than the thickness of the HDP oxide layer 158 above the extrinsic base layer 156 over narrow sacrificial emitter structures 146. Trapezoidal-like structures 162 with the full HDP oxide thickness deposited over wide sacrificial emitter features 148 are converted into two triangular-like structures with the height less than the HDP film thickness on the flat area by means of conventional photolithography techniques. This facilitates the complete removal of the triangular-like structures 160, 168 and 170 without completely removing the HDP oxide layer 158 above the extrinsic base layer 156. Once the triangular-like structures 160, 168 and 170 are completely removed, the sacrificial emitter structures 146 and 148 can be completely removed while the remaining HDP oxide layer 158 protects the underlying extrinsic base layer 156.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of forming a bipolar device and CMOS device, comprising:
    forming an isolation structure within a substrate;
    forming a collector implant region within said substrate on a first side of said isolation structure;
    forming a polysilicon gate of said CMOS device above said substrate and laterally on a second side of said isolation structure, wherein said second side is opposite said first side;
    forming a protection layer over said polysilicon gate;
    forming an intrinsic base structure over said collector implant region;
    forming a sacrificial emitter structure over said intrinsic base structure;
    forming an extrinsic base structure over said intrinsic base region adjacent to said sacrificial emitter structure and over said sacrificial emitter structure;
    forming a first portion of a mask layer over said extrinsic base structure adjacent said sacrificial emitter structure and a second portion of said mask layer over said extrinsic base structure over said sacrificial emitter structure, wherein a thickness of said first portion of said mask layer is greater than a thickness of said second portion of said mask layer;
    removing said second portion of said mask layer without removing all of said first portion; and
    removing said sacrificial emitter structure and the extrinsic base structure thereover while said first portion of said mask layer protects said extrinsic base structure adjacent said sacrificial emitter structure.

2. The method of claim 1, further comprising forming a permanent emitter structure in a space created by said removal of said sacrificial emitter structure.

3. The method of claim 1, wherein said mask layer comprises an oxide.

4. The method of claim 3, wherein said oxide is formed by a high density plasma (HDP) deposition.

5. The method of claim 1, wherein said second portion of said mask layer comprises a triangular-like structure.

6. The method of claim 5, wherein said triangular-like structure has a maximum thickness approximately equal to half the width of said sacrificial emitter structure.

7. The method of claim 1, further comprising forming a spacer adjacent to said sacrificial emitter structure.

8. The method of claim 1, further comprising removing said first portion of said mask layer off of said extrinsic base structure.

9. The method of claim 1, wherein said isolation structure comprises a shallow and deep trench isolation structure.

10. The method of claim 1, wherein said protection layer comprises an oxide and/or a nitride.

11. The method of claim 1, further comprising forming a spacer adjacent to said polysilicon gate.

* * * * *